US012774521B1

(12) United States Patent
Pingenot

(10) Patent No.: US 12,774,521 B1
(45) Date of Patent: Oct. 27, 2026

(54) ACOUSTIC-CONTROLLED MATERIAL DEPOSITION

(71) Applicant: Google LLC, Mountain View, CA (US)

(72) Inventor: Joseph Albert F. S. Pingenot, Gibsonia, PA (US)

(73) Assignee: Google LLC, Mountain View, CA (US)

( * ) Notice: Subject to any disclaimer, the term of this patent is extended or adjusted under 35 U.S.C. 154(b) by 865 days.

(21) Appl. No.: 17/806,262

(22) Filed: Jun. 9, 2022

(51) Int. Cl.

| | |
|---|---|
| ***C23C 16/44*** | (2006.01) |
| ***C23C 16/52*** | (2006.01) |
| ***C23C 16/56*** | (2006.01) |
| ***C30B 23/00*** | (2006.01) |
| ***C30B 23/02*** | (2006.01) |
| ***C30B 30/06*** | (2006.01) |
| ***H10P 14/00*** | (2026.01) |
| ***H10P 74/20*** | (2026.01) |

(52) U.S. Cl.
CPC .......... *C23C 16/4415* (2013.01); *C23C 16/52* (2013.01); *C23C 16/56* (2013.01); *C30B 23/002* (2013.01); *C30B 23/02* (2013.01); *C30B 30/06* (2013.01); *H10P 14/00* (2026.01); *H10P 74/203* (2026.01)

(58) Field of Classification Search
CPC ..... C23C 16/4415; C23C 16/52; C23C 16/56; C30B 23/002; C30B 23/02; C30B 30/06; H01L 21/02104; H01L 22/12
See application file for complete search history.

(56) References Cited

U.S. PATENT DOCUMENTS

2019/0206745 A1 7/2019 Kayser et al.
2021/0398831 A1 12/2021 Oberai et al.

FOREIGN PATENT DOCUMENTS

JP 2003228017 8/2003

OTHER PUBLICATIONS

Garcia-Valenzuela et al. "Patterning and control of the nanostructure in plasma thin films with acoustic waves: mechanical vs. electrical polarization effects" Mater. Horiz., 2021.*

(Continued)

*Primary Examiner* — Robert S Walters, Jr.
(74) *Attorney, Agent, or Firm* — Colby Nipper PLLC

(57) ABSTRACT

This document discloses techniques, apparatuses, and systems for acoustic-controlled material deposition. Material deposition is often used in manufacturing to create layered structures. Current material deposition methods, however, are incapable of adequately controlling the deposition of material to a desired resolution, which in some applications (e.g., semiconductors) may be required to improve performance or provide pathways toward new technology. In contrast to these techniques, acoustic-controlled material deposition utilizes mechanical signals to control the deposition of a material on a substrate. Specifically, a mechanical signal is transmitted by a transducer to cause oscillations within the substrate. Portions of the substrate are expanded or compressed in accordance with the oscillations, and material is deposited at portions of the substrate based on this expansion or compression. By controlling the mechanical signals, the oscillations may be configured to enable material to be selectively deposited on the substrate.

20 Claims, 12 Drawing Sheets

(56) References Cited

OTHER PUBLICATIONS

Biroun et al. "Surface Acoustic Waves to Control Droplet Impact onto Superhydrophobic and Slippery Liquid-Infused Porous Surfaces" ACS Appl. Mater. Interfaces 2021,13, 46076-46087. (Year: 2021).*

Lee et al. "Preparation and properties of amorphous TiO2 thin films by plasma enhanced chemical vapor deposition" Thin Solid Films, 237 (1994) 105-111 (Year: 1994).*

Ratova et al. "Micro-Patterning of Magnetron Sputtered Titanium Dioxide Coatings and Their Efficiency for Photocatalytic Applications" Coatings 2020, 10, 68 (Year: 2020).*

Vallat et al. "Area selective deposition of TiO2 by intercalation of plasma etching cycles in PEALD process: A bottom up approach for the simplification of 3D integration scheme" J. Vac. Sci. Technol. A 37, 020918 (2019) (Year: 2019).*

* cited by examiner

ACOUSTIC-CONTROLLED MATERIAL DEPOSITION

BACKGROUND

Material deposition is a common technique utilized to manufacture many of the devices relied on in day-to-day life. For example, electronic devices include processors that provide functionality to those devices, and these processors are often grown through a material deposition process that deposits thin layers of material on a substrate. Various techniques have been developed to control this deposition. These techniques, however, may fail to provide adequate resolution or scalability to enable some designs that may improve processor performance.

SUMMARY

This document discloses techniques, apparatuses, and systems for acoustic-controlled material deposition. Material deposition is often used in manufacturing to create layered structures. Current material deposition methods, however, are incapable of adequately controlling the deposition of material to a desired resolution, which in some applications (e.g., circuits) may be required to improve performance. In contrast to these techniques, acoustic-controlled material deposition utilizes acoustic signals to control the deposition of a material on a substrate. Specifically, an acoustic signal is transmitted by a transducer to cause oscillations within the substrate. Portions of the substrate are expanded or compressed in accordance with the oscillations, and material is deposited or deposition is prevented at portions of the substrate based on this expansion or compression. By controlling the acoustic signals, the oscillations may be configured to enable material to be selectively deposited on the substrate.

A method is described that includes utilizing a transducer to transmit an acoustic signal to disturb a substrate. The disturbance of the substrate may cause expansions or compressions in a portion of the substrate relative to an unstrained substrate or other portions of the substrate. Material may be deposited at the portion of the substrate based on the relative expansion or compression at the portion of the substrate.

An apparatus for performing the method is also described. The apparatus includes at least one processor. The at least one processor is configured to execute at least one computer-readable media that includes machine-executable instructions that, when executed by the at least one processor, cause the at least one processor to perform techniques for acoustic-controlled material deposition.

This document further describes a computer-readable media that includes machine-executable instructions that, when executed, configure a processor to perform the techniques for acoustic-controlled material deposition described herein.

This Summary is provided to introduce simplified concepts for implementing acoustic-controlled material deposition. The simplified concepts are further described below in the Detailed Description. This Summary is not intended to identify essential features of the claimed subject matter, nor is it intended for use in determining the scope of the claimed subject matter.

BRIEF DESCRIPTION OF THE DRAWINGS

The details of one or more aspects of the described techniques, apparatuses, and systems for acoustic-controlled material deposition are described below. The use of the same reference numbers in different instances in the description and the figures indicate similar elements.

DETAILED DESCRIPTION

Figure 1:
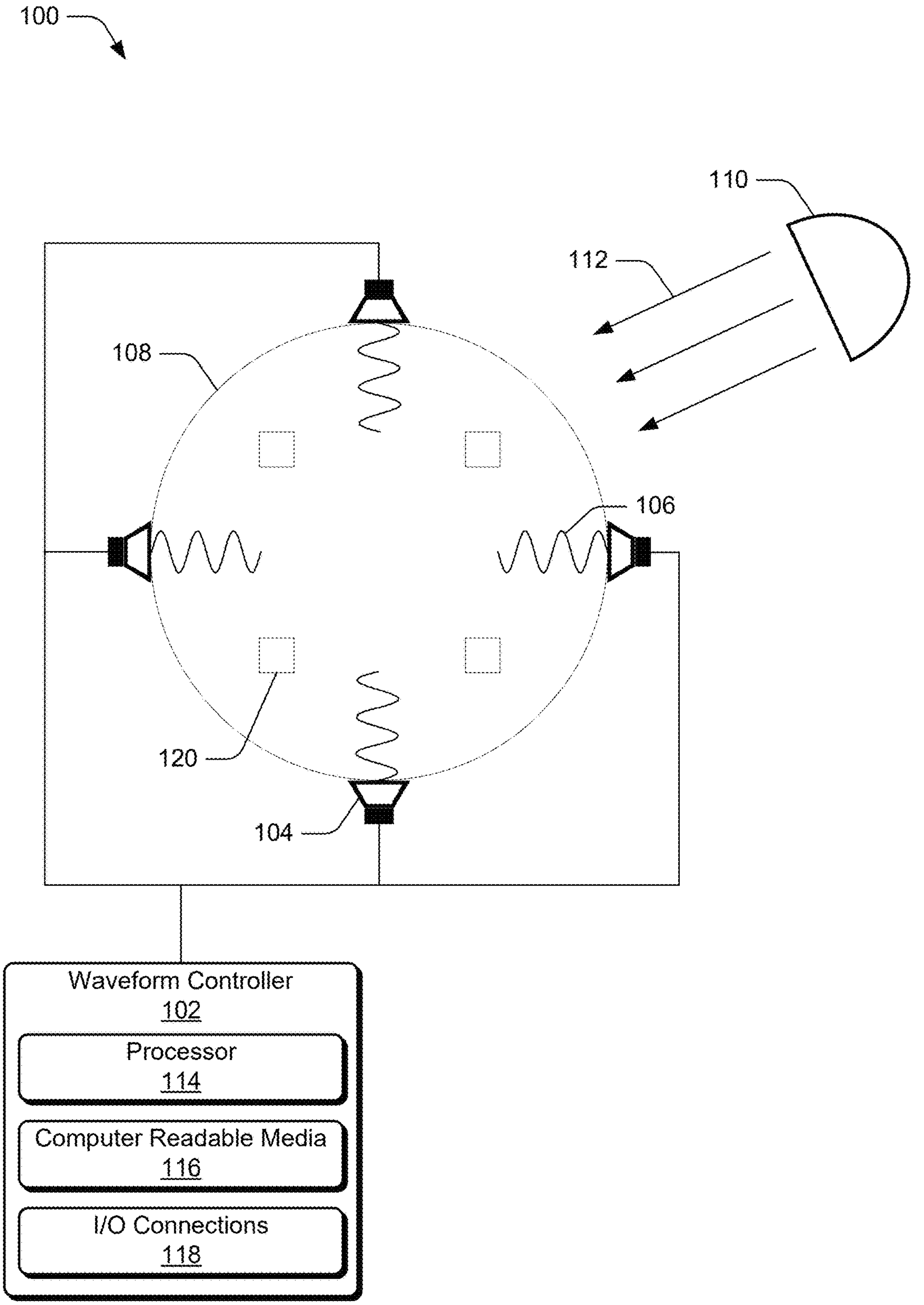
FIG. 1 illustrates an example operating environment in which one or more aspects of acoustic-controlled material deposition may be performed.

Many products developed today are designed through material deposition. In some instances, material deposition may produce a thin film of material on the surface of a substrate. These thin films often include their own properties that can be used to improve or enhance the design of the substrate or to build (or grow) a structure on the substrate through a layering process. As specific examples, a hydrophobic material may be deposited on a product to improve waterproofing or a conductive material may be deposited on a substrate to develop electronic structures.

Take, for example, an electronic device, which includes a processor (e.g., integrated circuit (IC)) that executes computer-readable media to provide functionality to the device. In general, processors are developed through deposition of material onto a substrate (e.g., silicon) to create a composite structure. To control the deposition of material and enable the creation of specific designs, photolithography may be used to mask layers of a composite structure from etching, thereby enabling specific designs to be created. While this technique is sufficient to create some designs, the resolution of photolithography may limit the ability to create other designs that may enable improved processing power and speed.

As processors have improved, the capabilities of electronic devices and their impact on everyday life have continued to evolve. With improved processing speeds, electronic devices have enabled various technologies, such as artificial intelligence and machine learning, which require increasingly complex computations that years ago would have been unfathomable. These technologies, however, are now believed to be fundamental building blocks for future discovery and improvement, and thus, improving the capabilities of processors is of the utmost importance.

At a basic level, processors are composed of a particular collection of transistors organized in such a way as to provide a specific functionality. In general, as the number of transistors on a processor increases, the computational capabilities of that processor increase. Because of this relationship, modern circuit design has focused on the ability to increase the number of transistors on a processor while maintaining the same overall size. To achieve higher density circuit designs, photolithography has been improved to create designs as small as, for example, ten nanometers (nm). While this resolution of photolithography has greatly improved processing capabilities of modern-day processors, more precise techniques may enable even more-capable designs to be implemented. Despite the benefits, more-precise techniques have been limited in usefulness due to scalability issues across a single processor or multiple processors.

In contrast to current techniques, acoustic-controlled material deposition may utilize acoustic signals to selectively excite portions of a substrate during the material deposition process. Specifically, a waveform may be introduced to a substrate to cause atomic oscillation in the substrate. In accordance with the waveform, specific portions of the substrate, sometimes referred to as "hot" areas, may experience greater disturbances, while other portions of the substrate, referred to as "cold" areas, may be disturbed less. Due to atomic oscillations caused by these disturbances, the substrate may compress or expand in different amounts at different areas. During material deposition, a material may be more likely to deposit on a substrate with a particular density or lattice structure, and thus, these expansions or compressions may affect material deposition.

By controlling the particular waveform that creates disturbances in the substrate, it may be possible to selectively deposit material at different portions to produce different designs. Given that this technique may rely on atomic oscillations, it may be possible to create designs with a resolution of a small number of atoms, or in some cases, a single atom, which may enable the creation of even more powerful and efficient circuit designs.

While this technique may enable a greater number of transistors to exist within the same sized processor, small-scale deposition techniques may have valuable applications to quantum computing. Quantum computing leverages quantum-mechanical properties of a device to perform computing. The quantum behavior of particles (e.g., superposition, entanglement, and interference) can be analyzed to provide more detailed information within a quantum device. One such quantum device is a quantum dot. A quantum dot may have properties that differ from larger particles due to the effect of quantum mechanics. These properties may be utilized in various applications, including solar panels, biomedical devices, computing devices, or displays.

In relation to circuit elements, quantum computing may improve the performance of standard processors by leveraging the detailed information conveyed through these quantum-mechanical properties. Quantum dots may be implemented at separate locations along a substrate. Instead of representing an "ON" or "OFF" state (e.g., like a transistor), each quantum dot may include a number of characteristics (e.g., spin or charge) that exist in a coherent superposition of states. By coupling these characteristics with other quantum information (e.g., entanglement with other particles entanglement with other particles), quantum computations may be performed. These computations may be used in larger quantum algorithms, which fundamentally operate different than classical algorithms and in doing so, simplify the solutions of certain problems (e.g., Grover or Shor's algorithms). Current circuit design techniques, however, may not be usable to create these small features (e.g., a finely controlled grid), which may require atom-level deposition. In this way, acoustic-controlled material deposition, as described herein, may enable massive improvements in processor capability in relation to quantum computing.

In addition to providing deposition at increased resolution, acoustic-controlled material deposition may be scalable to larger applications. In general, different waveforms may be used to create different designs across various devices, including active or passive circuit elements. Once the particular waveform is determined for a design, the waveform may simply be transmitted during deposition. This process may be consistent across each processor, thereby scaling seamlessly. These techniques may also be scalable to different-sized substrates allowing multiple semiconductors to be grown simultaneously on a single substrate. Thus, acoustic-controlled material deposition may be appropriate in even the largest-scale manufacturing.

In an example implementation, acoustic transducers are fixed to or located proximate to a substrate. The acoustic transducers transmit acoustic waves into the substrate that cause atomic oscillations within the substrate. During oscillation, the substrate is exposed to the deposition material through a deposition system, and material is selectively deposited on the surface of the substrate. To determine the proper waveforms for a particular design, measuring transducers may be placed on or adjacent to the substrate to determine how specific portions of the substrate react to a particular waveform. By tuning waveform generation based on measurements received at the measuring transducers, different designs may be deposited on the substrate.

It should be noted that this is but one example of acoustic-controlled material deposition, and other examples will be described below. This disclosure will now turn to a description of an example operating environment, followed by example systems and example transducers in accordance with one or more aspects of acoustic-controlled material deposition and various techniques for utilizing acoustic signals to selectively deposit material onto a substrate.

Example Environment

FIG. 1 illustrates an example operating environment 100 in which one or more aspects of acoustic-controlled material deposition may be performed. The environment 100 includes a waveform controller 102. The waveform controller 102 may transmit signaling indicative of one or more acoustic signals to be output at transducers 104. The transducers 104 output the acoustic signals 106 to disturb a substrate 108. The acoustic signals 106 may be transmitted proximate to the substrate 108 and cause portions of the substrate 108 to expand or compress due to oscillations within the substrate 108. During the transmission of the acoustic signals 106, a material deposition system 110 may deposit material 112 on the surface of the substrate 108. Based on the particular acoustic signals 106 transmitted by the transducers 104 and the resulting atomic oscillations of the substrate 108, the material 112 may selectively deposit at particular locations of the substrate 108 in accordance with a particular design. In this way, the waveform controller 102 may adjust one or more parameters of the acoustic signals 106 (e.g., frequency or amplitude) to control deposition of the material 112 on the substrate 108.

Although many scenarios exist in which material deposition may be used, the environment 100 illustrates acoustic-controlled material deposition in accordance with circuit design. The substrate 108 may be a thin disk of a semiconductor material, for example, silicon. Material 112 may be selectively deposited on the substrate 108 to build a composite structure based on a particular circuit design. The substrate 108 may be diced into individual die, to be packaged and utilized by an electronic device. The resulting dice may be any type of die, for example, although discussed as processors, the dice may include memory die, storage die, processors, microprocessors, a multicore of a multicore central-processing unit (CPU) or application processor (AP), an application-specific integrated circuit (ASIC), graphics processing unit (GPU), or a system on chip (SoC).

The dice may be installed within or designed for any suitable electronic device, some of which include a smartphone, a tablet computer, a laptop computer, a gaming console, a desktop computer, a server computer, a wearable computing device (e.g., smart-watch), a broadband router (e.g., mobile hotspot), a mobile station (e.g., fixed- or mobile-STA), a mobile communication device, a client device, a user equipment, a mobile phone, an entertainment device, a mobile gaming console, a personal media device, a media playback device, a health monitoring device, a drone, a camera, an Internet home appliance capable of wireless Internet access and browsing, an IoT device, and/or other types of electronic devices.

Based on the particular application of a die, the waveform controller 102 may output different waveforms to deposit different designs on the substrate. In aspects, the waveform controller 102 may be any electronic device, including those detailed above and implemented through any combination of hardware, software, or firmware. The waveform controller 102 includes at least one processor 114 capable of executing computer-readable storage media (CRM) 116, which may include memory media or storage media. Similar to the processors described above, the processor 114 may be implemented as a general-purpose processor (e.g., of a multicore CPU or AP), ASIC, GPU, or an SoC with other components of the waveform controller 102 integrated therein.

The CRM 116 can include any suitable type of memory media or storage media, such as read-only memory (ROM), programmable ROM (PROM), random access memory (RAM), dynamic RAM (DRAM), static RAM (SRAM), or Flash memory. In the context of this discussion, the CRM 116 is implemented as at least one hardware-based or physical storage device, which does not include transitory signals or carrier waves. Applications, firmware, and/or an operating system (not shown) of the waveform controller 102 can be embodied on the CRM 116 as processor-executable instructions, which may be executed by the processor 114 to provide various functionalities described herein. The CRM 116 may also store device data, such as user data or user media that is accessible through the applications, firmware, or operating system of the waveform controller 102.

The waveform controller 102 may include one or more input/output (I/O) connections 118 to couple to one or more other devices. The I/O connections 118 of the waveform controller 102 may include universal serial bus (USB) ports, coaxial cable ports, fiber optic ports for optical fiber interconnects or cabling, and other serial or parallel connectors (including internal connectors) useful to couple the waveform controller 102 to various components, peripherals, or accessories such as sensors, keyboards, microphones, or cameras. In the environment 100, the I/O connections 118 may be used to couple one or more measuring transducers 120 or one or more acoustic transducers 104 to the waveform controller 102. Although not shown, the waveform controller 102 may include a transceiver to communicate with any of the various components, peripherals, or accessories (e.g., the transducers 104 or the measuring transducers 120) through wired or wireless communication. The measuring transducers 120 may be used to calibrate the waveform controller 102 to determine the appropriate waveform or set of waveforms for transmission at the transducers 104 to achieve a particular deposition pattern (e.g., based on the intended circuit design).

The waveform controller 102 may transmit signaling indicative of a particular waveform to the transducers 104, which transmit acoustic signals 106 in accordance with the signaling. The measuring transducers 120 may measure various data related to the disturbance of the substrate 108 due to the acoustic signals 106. From this data, the waveform controller 102 may determine how particular waveforms affect the substrate 108, and thus, determine which waveforms are to be transmitted to achieve particular circuit designs.

The measuring transducers 120 may be any appropriate sensor usable to determine a characteristic of the substrate 108 due to the acoustic signal 106. For example, the measuring transducers 120 may measure inertial data related to a particular portion of the substrate. The inertial data may include velocity data or acceleration data of the particular portion of the substrate 108. Additionally or alternatively, the measurement transducers 120 may measure displacement at a portion of the substrate 108. In some implementations, the measuring transducers 120 may be attached to the substrate 108 (e.g., to the bottom surface, an edge, the top surface, etc.).

Alternatively or additionally, the measuring transducers 120 may be located in the proximity of and directed towards the substrate 108. For example, the measuring transducers 120 may include a laser and a receive sensor, where the laser is directed at a portion of the substrate 108, and a reflection of the laser is received at a receive sensor. When disturbances occur, the reflection of the laser may alter the reflection of the laser received at the receive sensor. This received reflection may be usable to determine displacement or other data about the substrate 108 when exposed to the acoustic signal 106.

In some implementations, the measuring transducers 120 may include stress sensors to measure expansion or compression at portions of the substrate 108. Other examples of the measuring transducers 120 may include energy sensors, radar sensors, or lidar sensors. In general, however, the measuring transducers 120 provide data on the impact of the acoustic signals 106 on the substrate 108, which the waveform controller 102 can analyze to determine the appropriate waveform parameters (e.g., frequency or amplitude) to be transmitted by the transducers 104 to achieve a desired deposition pattern in accordance with a particular circuit design.

The indications of the waveforms determined by the waveform controller 102 may be received by the transducers 104 and the waveforms may be transmitted as the acoustic signals 106. Although illustrated in a particular implementation (e.g., fixed to the edge of the substrate), the transducers 104 may be arranged the same as or different than the example shown. As a non-illustrated example, the transducers 104 may be situated on a bottom surface of the substrate 108 different from the surface in which the material 112 is deposited. In general, the transducers 104 may be arranged in any location contacting or proximate to the substrate 108. The transducers 104 may include a single transducer or multiple transducers. The transducers 104 may include any suitable transducer that can transmit a mechanical wave based on an electrical signal, for example, a speaker. The transducers 104 will be described in greater detail with respect to the specific examples illustrated in FIGS. 8 and 9.

The acoustic signals 106 may include any appropriate mechanical signal. The acoustic signals 106 may be within the audible frequency range or outside the audible frequency range. As non-limiting examples, the acoustic signals 106 may include vibration, sounds, ultrasound, or infrasound. The acoustic signals 106 may have any frequency or amplitude as defined by the waveform controller 102 and limited by the transducers 104. In general, the acoustic signals 106 are transmitted towards the substrate 108 to cause oscillations within the substrate 108.

The substrate 108 may be composed of any appropriate material. For example, the substrate 108 may be any element, compound, polymer, and so on. In the circuit design example, the substrate 108 may be any semiconductor material, such as silicon (Si), germanium (Ge), tin (Sn), selenium (Se), or tellurium (Te). In some cases, non-centrosymmetric semiconductors, such as indium phosphide (InP) or gallium arsenide (GaAs) wafers, may provide electromagnetic signals from expansion/compression (e.g., piezoelectrics). The substrate 108 may be doped through an injection of polarized atoms into the substrate 108 to control an electrical property of the substrate 108. The substrate 108 may be implemented as a wafer of various sizes to be segmented into multiple dice. In aspects, the doped wafer may be used to grow the circuitry in a layered structure.

The material deposition system 110 may be used to deposit each layer onto the substrate 108. The material deposition system 110 may use any number of appropriate techniques for material deposition. As non-limiting examples, the material deposition system 110 may deposit the material 112 using any form of chemical vapor deposition (CVD) (e.g., metalorganic CVD (MOCVD)), vapor-phase epitaxy (VPE), or molecular-beam epitaxy (MBE). The material deposition system 110 may include temperature and pressure control, for example, to create a vacuum chamber. The material 112, may be moved throughout the system through pressurization or fans.

The material 112 may include any appropriate element or compound. For example, the material 112 may include, as a few examples, oxygen (O), hydrogen (H), silicon (Si), Nitrogen (N), tungsten (W), carbon (C), copper (Cu), titanium (Ti), combinations thereof, and the like. It should be noted that these are but a few examples and any other element or compound may be deposited using the material deposition system 110. In general, the material 112 may be exposed to the substrate 108 as a compound with a carrier gas, for example, helium (He). In aspects, the carrier gas may be an inert gas. The material 112 may be exposed to the substrate 108 in gaseous form and deposit as a solid or liquid on the substrate 108. The material 112 may be deposited in a particular pattern or in accordance with a particular design due to the disturbances caused by the acoustic signals 106 and controlled by the waveform controller 102.

Example System

Figure 2:
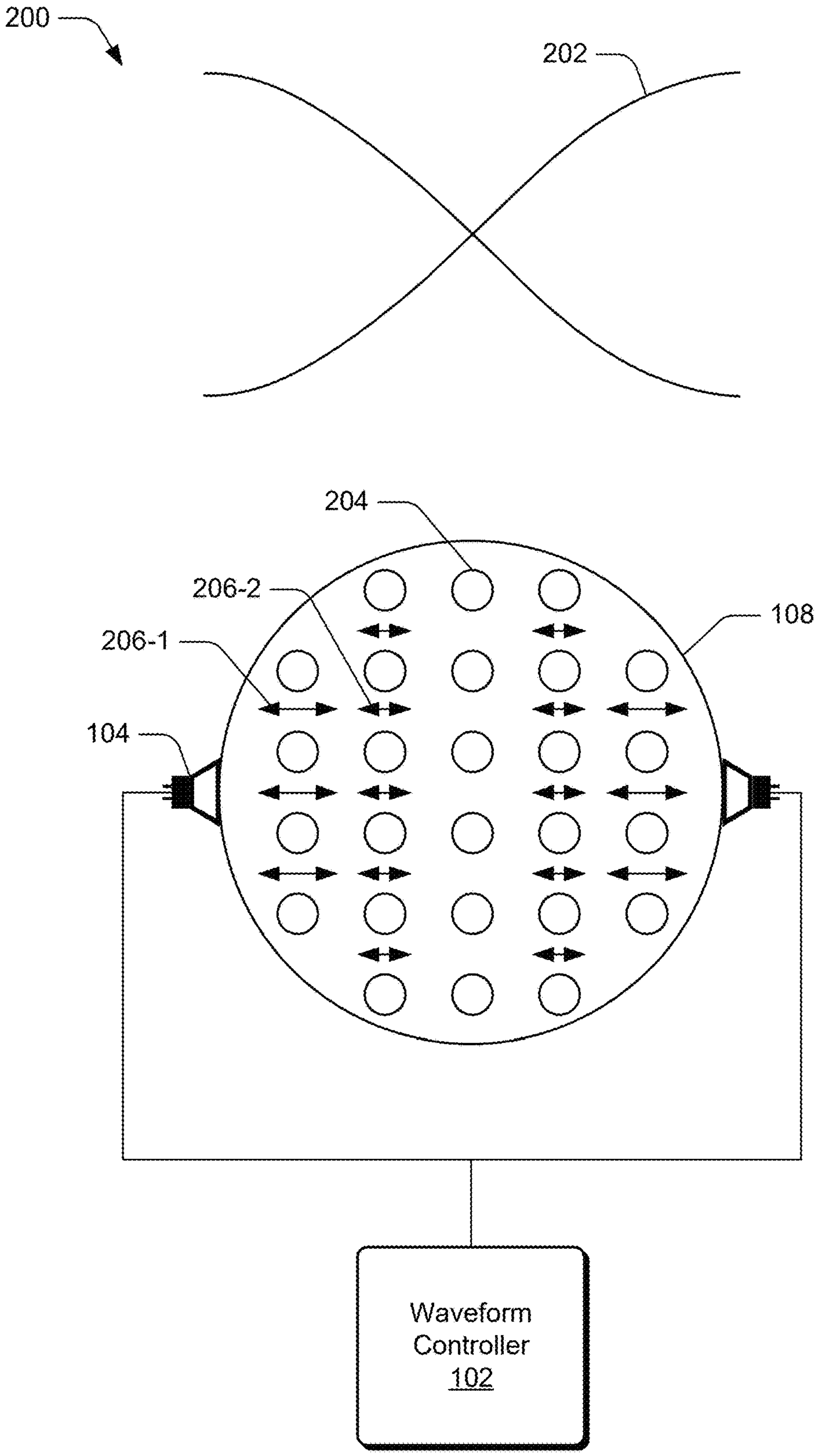
FIG. 2 illustrates an example implementation of acoustic-controlled material deposition, including transducers located at an edge of a substrate.

FIG. 2 illustrates an example implementation 200 of acoustic-controlled material deposition, including transducers 104 located at an edge of a substrate 108. In the example implementation 200, the waveform controller 102 is coupled to transducers 104 located at opposing edges of the substrate 108. Although illustrated in a particular arrangement, the transducers 104 may include a greater or lesser number of transducers than illustrated in FIG. 2. Moreover, the transducers 104 may be located on or adjacent to other areas of the substrate 108, for example, at or adjacent to any other location on the perimeter or surface of the substrate 108.

In the example implementation 200, the transducers 104 transmit a waveform, in accordance with signaling received from the waveform controller 102. The waveform may propagate in a single dimension parallel to the surface of the substrate; however, in other implementations, the waveform may propagate in one or more other dimensions. For example, by altering the location or direction of the transducers 104, the waveform could propagate in the x, y, or z dimension, or combinations thereof, as defined by the substrate 108. It should thus be appreciated that any other arrangement of the transducers 104 with respect to the substrate 108 may be appropriate to cause respective disturbances in the substrate 108. As illustrated, the propagation of the waveform causes relative oscillation amplitudes 202 at portions of the substrate 108. Some locations oscillate with larger amplitudes (e.g., near the transducers 104), while other locations oscillate with lower amplitudes or do not oscillate (e.g., the middle of the substrate).

Returning to the example implementation 200, the substrate 108 is composed of atoms 204, which experience expansion or compression 206 based on the waveform. In aspects, the atoms 204 are represented in a lattice structure to illustrate the surface of the substrate 108. The transducers 104 transmit the waveform (e.g., each transducer transmits the waveform to cause oscillations in the substrate 108 at the atomic level). In this way, the transducers 104 may affect the substrate 108 at a granularity of multiple atoms or even a single atom. Based on the waveform the atoms 204 may oscillate differently from one another (e.g., with different oscillation amplitudes 202 or frequencies). For example, the atoms 204 closest to the transducers 104 may experience higher expansion or compression 206-1 (e.g., shown as large amplitudes in the oscillation amplitudes 202) at this location due to the propagation of the waveform. This high amount of disturbance or oscillation may be considered a "hot" zone, where atoms experience larger disturbances. Atoms located farther from the transducers 104 may experience lesser expansion or compression 206-2 (shown as a lesser amplitude in the oscillation amplitudes 202) due to waveform characteristics at this location. Moreover, the atoms at the center of the substrate 108 may experience no expansion or compression (shown as no amplitude in the oscillation amplitudes 202) due to the waveforms cancelling or not creating an effect at this location. These atoms may make up a "cold" zone of the substrate 108, where atoms experience lower relative disturbances.

From this example, it can be seen that by varying the parameters of the waveform (e.g., frequency or amplitude), it may be possible to achieve different patterns of expansion and compression where some atoms 204 are "hot" and others are "cold." In some instances, the transducers 104 may be arranged to transmit the waveform in at least two dimensions. In doing so, each atom 204 may be disturbed individually, in contrast to the atoms 204 being disturbed in columns, as shown in FIG. 2.

By altering the position of the transducers 104 and the waveform, different patterns of "hot" and "cold" zones may be created on the substrate 108. During deposition, material may deposit more successfully based on the level of disturbances in that portion of the substrate 108 (e.g., better deposition in "cold" zones in comparison to "hot" zones). In aspects, the expansion or compression 206 at different portions of the substrate may affect the lattice structure, and deposition may be more successful when the substrate 108 has a particular lattice structure (e.g., when the lattice structure of the substrate 108 matches a lattice structure of the material). By selectively controlling the waveform, material deposition may occur in certain locations, as defined by a particular design. Given that these disturbances in the substrate 108 can be very precise, acoustic-controller material deposition may be controlled to a finer resolution than previous methods. For example, material deposition may be controlled to a resolution of less than ten nanometers (nm) or even to the resolution of a single atom.

Figure 3:
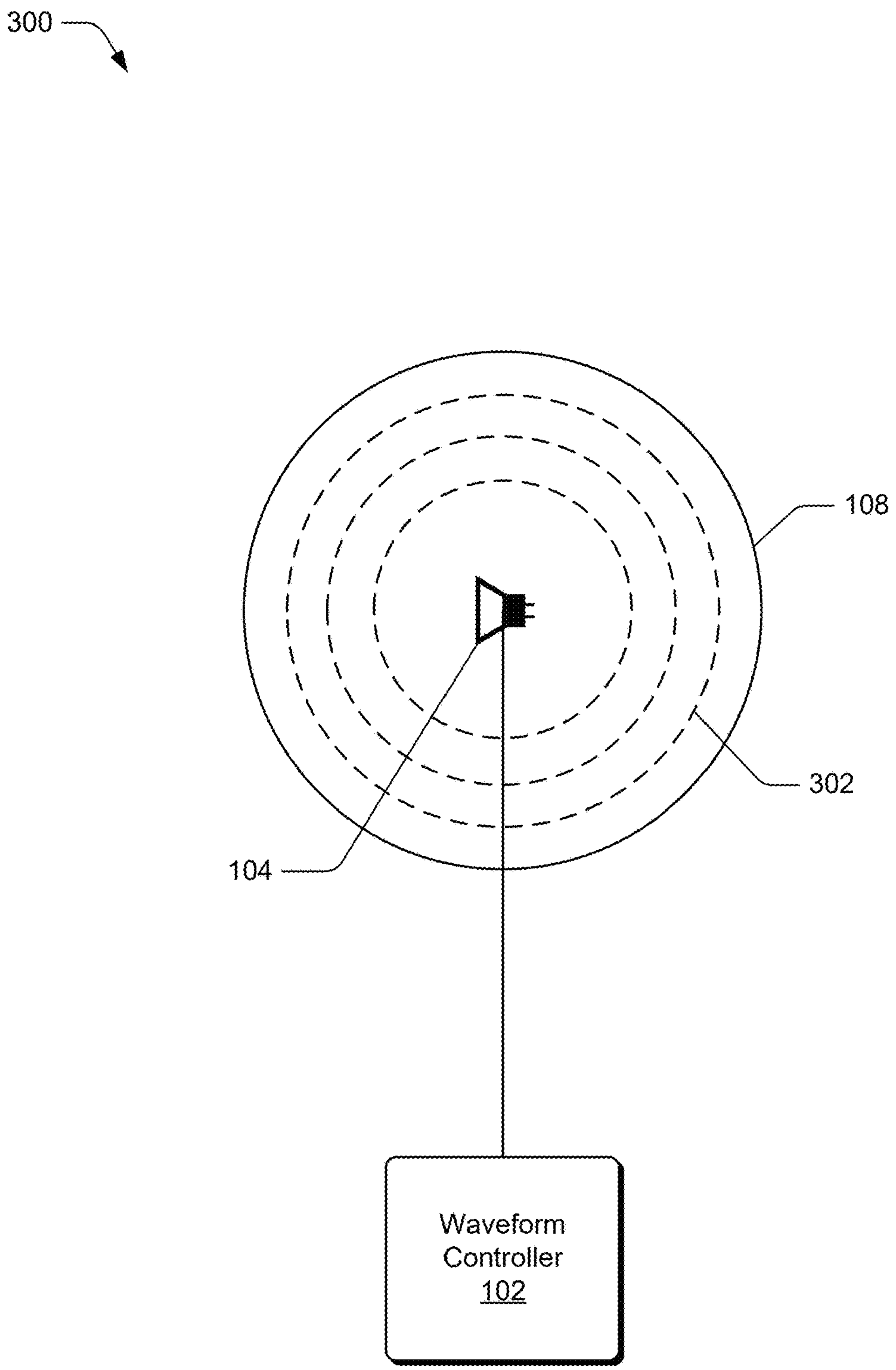
FIG. 3 illustrates an example of acoustic-controlled material deposition, including transducers located at a bottom surface of a substrate.

FIG. 3 illustrates an example implementation 300 of acoustic-controlled material deposition, including a transducer 104 located at a bottom surface of a substrate 108. The transducer 104 may transmit a waveform based on signaling received from the waveform controller 102. The transducer may transmit the waveform as an acoustic signal in such a way as to disturb atoms within the substrate 108. In the example implementation 300, the transducer 104 is fixed to or proximate to the bottom surface and transmits the waveform perpendicular to the bottom surface. As a result, the atoms may be expanded or compressed in a pattern of concentric circles 302.

The concentric circles 302 may represent locations in which the lattice of the substrate 108 has been expanded or compressed to match a preferred lattice structure of the material (e.g., the same as or different from the lattice structure of the material). These concentric circles 302 may be appropriately "hot" or "cold" for successful deposition, and thus, material may be deposited at the concentric circles 302.

It is important to note that, like the example implementation 200 of FIG. 2, the example implementation 300 is but one example arrangement of the transducers 104. For example, other implementations exist that include combinations of the arrangements shown in FIGS. 2 and 3 (e.g., transducers 104 being fixed or proximate to the edges and the bottom surface of the substrate 108). By adjusting the arrangement of the transducers 104 and the waveform, different expansion and compression patterns may occur within the substrate 108 and deposition may succeed at different portions of the substrate 108 to implement different designs.

Figure 4:
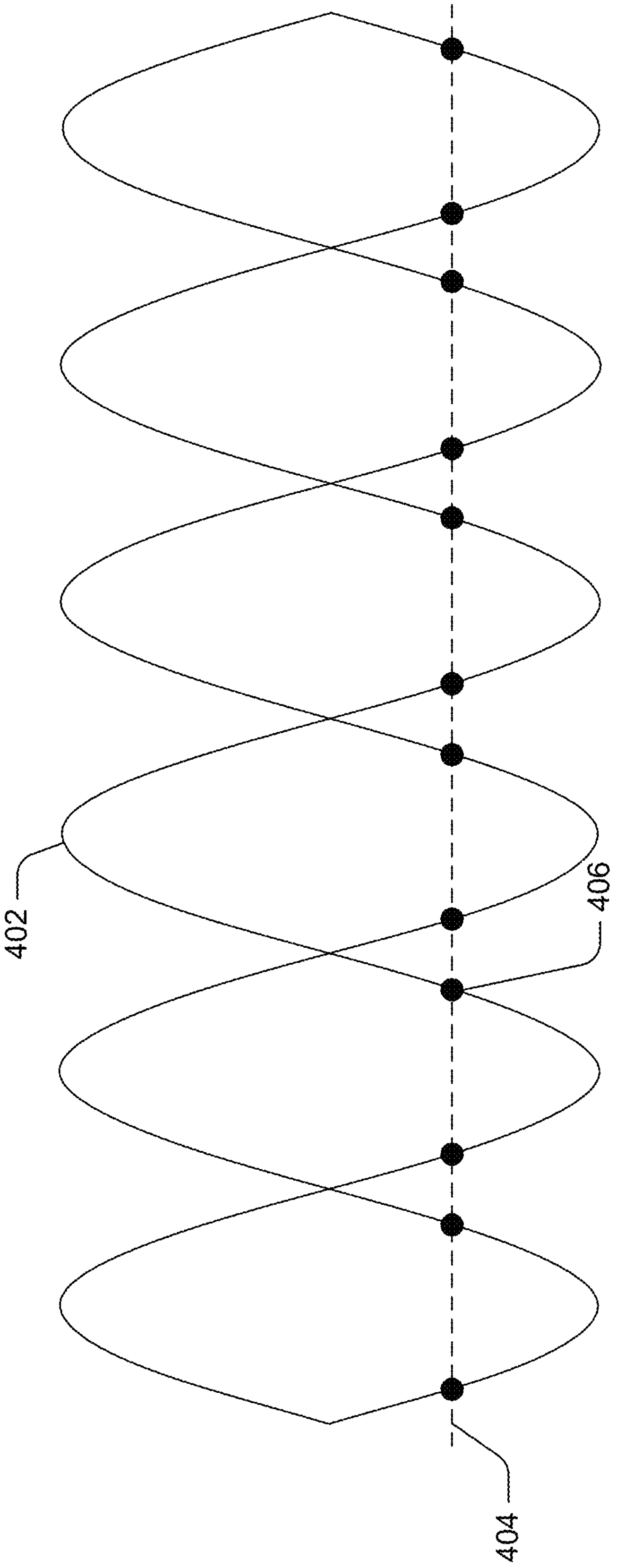
FIG. 4 illustrates an example of oscillations in accordance with one or more aspects of acoustic-controlled material deposition.

FIG. 4 illustrates an example of oscillations in accordance with one or more aspects of acoustic-controlled material deposition. Waveforms may be transmitted by one or more transducers located on or proximate to a substrate to cause oscillation in the substrate with amplitudes 402. As a result, the substrate may experience oscillations similar to those illustrated in FIG. 4.

The material that is to be deposited on the substrate may be determined to have a preferred lattice distance 404, defined by a lattice structure of the substrate that the material is likely to successfully deposit on. In aspects, the preferred lattice distance 404 may match the lattice structure of the material when deposited on the substrate. The waveform may cause expansion or compression of the substrate, which expands or compresses the lattice structure. Given that this oscillation may occur at the atomic level within the substrate, the substrate will include sets of single or multiple atoms in which the lattice structure matches the preferred lattice distance 404. These portions of the substrate may be referred to as deposition points 406, where the relative expansion or compression of the atoms may enable the material to successfully deposit at these locations.

In general, the substrate may include one or more deposition points 406 when the substrate is disturbed. The deposition points 406 may be points in which no expansion or compression occurs, for example, when the amplitudes 402 are zero. Although the deposition points 406 shown in FIG. 4 are based on a single waveform, acoustic-controlled material deposition may utilize multiple waveforms transmitted from one or more transducers to control the location of deposition points 406.

Figure 5:
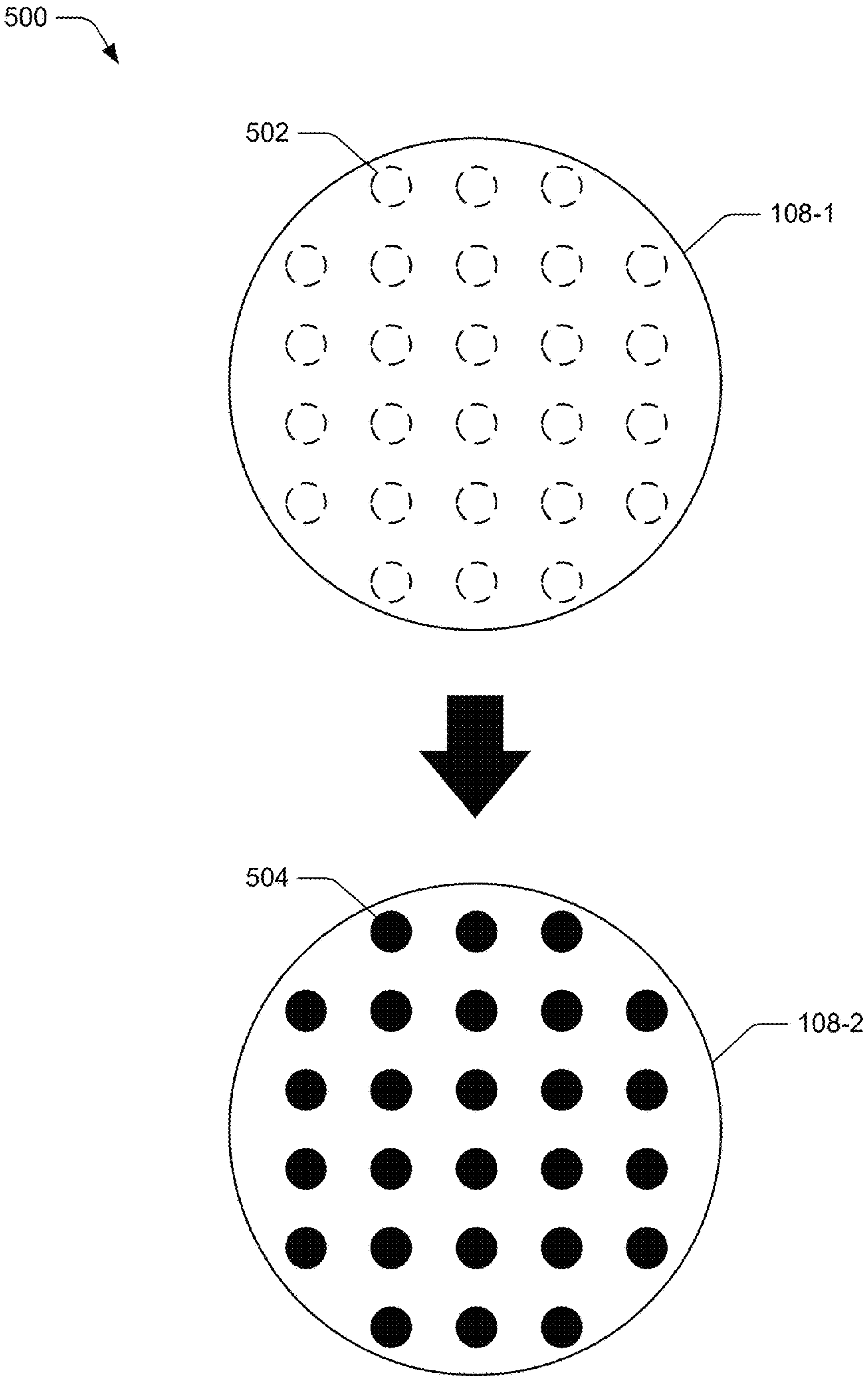
FIG. 5 illustrates an example of positive material deposition in accordance with one or more aspects of acoustic-controlled material deposition.

FIG. 5 illustrates an example of positive material deposition 500 in accordance with one or more aspects of acoustic-controlled material deposition. During the positive material deposition 500, the substrate is illustrated at two time periods. At a first time, the substrate 108-1 is illustrated with deposition points 502. The deposition points 502 are illustrated as a grid along the surface. In aspects, the substrate 108-1 may be exposed to acoustic waves in such a way that deposition is likely to succeed at the deposition points. In a specific example, the substrate may be exposed to acoustic signals propagated perpendicular to one another and parallel to the surface of the substrate 108-1.

By transmitting the acoustic signals in this manner, the substrate 108-1 may be expanded or compressed at various portions. This may create relative "hot" and "cold" zones at the substrate 108-1, which may affect the success of the deposition of the material at the surface of the substrate 108-1. For example, deposition may be more likely to succeed at the "cold" zones or the "hot" zones. In this example, the deposition points 502 may be locations in which the material deposition is likely to succeed based on the magnitude of disturbances at that location. In aspects, the deposition points 502 may be determined as locations where a lattice structure of the substrate 108-1 matches a preferred lattice distance 404. Specifically, the expansion or compression of the substrate 108-1 at a particular portion of the substrate may increase the success of material deposition at the location, thereby defining the deposition points 502.

Although shown in a particular arrangement in FIG. 5, note that the deposition points 502 may be located in other arrangements as defined by the location and direction of the transducers and the properties of the acoustic signals transmitted by the transducers. In this way, positive material deposition may be used to deposit material at the surface of the substrate in any pattern, for example, based on a particular circuit design.

In FIG. 5, the substrate 108-2 is then illustrated with deposited material 504. To create the substrate 108-2 as shown, a material deposition system may expose the substrate 108-1 to the material while the substrate 108-1 is disturbed by the acoustic signals transmitted by the transducers. The deposition process may take considerable time, and thus, the substrate 108-1 may be exposed to the material for at least a period of time that is sufficient to enable material deposition to succeed. The substrate 108-1 may be disturbed by the acoustic signals during the full deposition.

As a result of the material deposition, the deposited material 504 may be layered at the surface of the substrate 108-2. The top surface of the substrate 108-2 may be chemically etched to alter the design or depth of the deposition. In positive deposition, the material deposited may represent the physical design (e.g., in contrast to negative deposition where the deposited material represents the negative space around the physical design). In the case of circuit design, the material deposited may be a conductive material to enable the transport of electrical signals.

Although numerous deposition patterns are possible, some implementations may be particularly beneficial for a specific application. For example, quantum computing relies on the ability to deposit individual quantum dots that may store charge. In contrast to a transistor common in a standard processor, these quantum dots may have characteristics (e.g., spin of electrons) that when analyzed in relation to interaction with other particles may be useful in solving some types of problems.

To enable quantum computing, however, a material deposition system may be required to deposit individual quantum dots. This pattern of quantum dots may include small features that current circuit design methods struggle to create, particularly at scale. In contrast to these methods, acoustic-controlled material deposition may be able to deposit material at finer resolutions, for example, below a 10 nm accuracy, or in some cases, per atom. Moreover, these techniques utilize acoustic signals to deposit repeatable patterns of material across a portion of a wafer or its entirety. In doing so, acoustic-controlled material deposition may provide a scalable solution to implement even the smallest features within a design.

Figure 6:
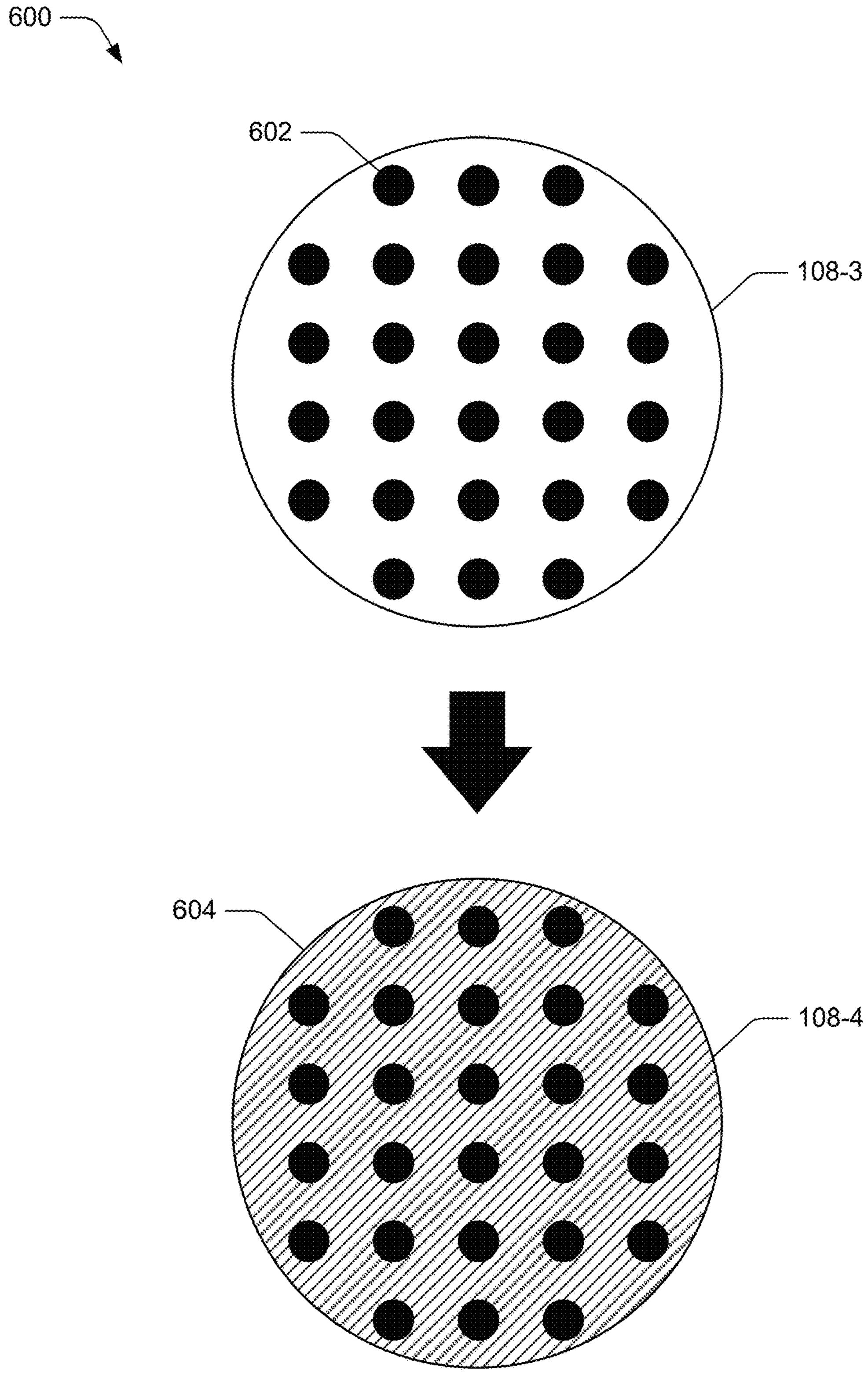
FIG. 6 illustrates an example of negative material deposition in accordance with one or more aspects of acoustic-controlled material deposition.

FIG. 6 illustrates an example of negative material deposition 600 in accordance with one or more aspects of acoustic-controlled material deposition. The substrate 108-3 is illustrated with material depositions 602. The material depositions 602 may be the result of positive depositions in accordance with one or more aspects of positive material deposition, as described with respect to FIG. 5. The material depositions 602 may be of the same or different material as the material depositions of FIG. 5.

The substrate 108-3 may undergo deposition to become the substrate 108-4. In aspects, this deposition results in the material fill-in 604. The substrate 108-3 may not be exposed to the acoustic signals during this deposition process as material may simply be deposited evenly to fill in the portions of the substrate 108-3 that are different from the material depositions 602. In doing so, the material fill-in may be controlled to the particular areas that are different from the area occupied by the material depositions.

Like positive deposition, negative deposition may be useful in a number of applications. In some implementations, negative deposition may be used to deposit two different materials within a layer of the final structure. In regard to circuit design, negative deposition may be used to deposit the physical microelectronics. For example, a non-conductive material may be deposited as the material depositions 602 and represent the blank space surrounding the electronics of the circuit. The material fill-in 604 may be deposited, representing the physical circuitry that provides the ability to carry electrical signals between circuit components. In this example, negative deposition may be beneficial when the physical circuit is more difficult to represent as waveforms than the empty space surrounding the electronics. Moreover, negative deposition may be particularly useful when the physical circuit covers a large area of the substrate 108-4.

Note that although illustrated with respect to a specific arrangement, negative deposition may be used to deposit any pattern and for any application. Other operations may be performed before, during, or after the negative deposition process to improve the deposition process. For example, the substrate 108-3 or the substrate 108-4 may be chemically etched at any point in the deposition process to further alter the design of the deposited material. In aspects, negative deposition may be an alternative to positive deposition, or it may be used in combination with positive deposition. Thus, it should be appreciated that the various aspects described with respect to FIGS. 5 and 6 may be combined in any manner without extending beyond the scope of the described acoustic-controlled material deposition.

Figure 7:
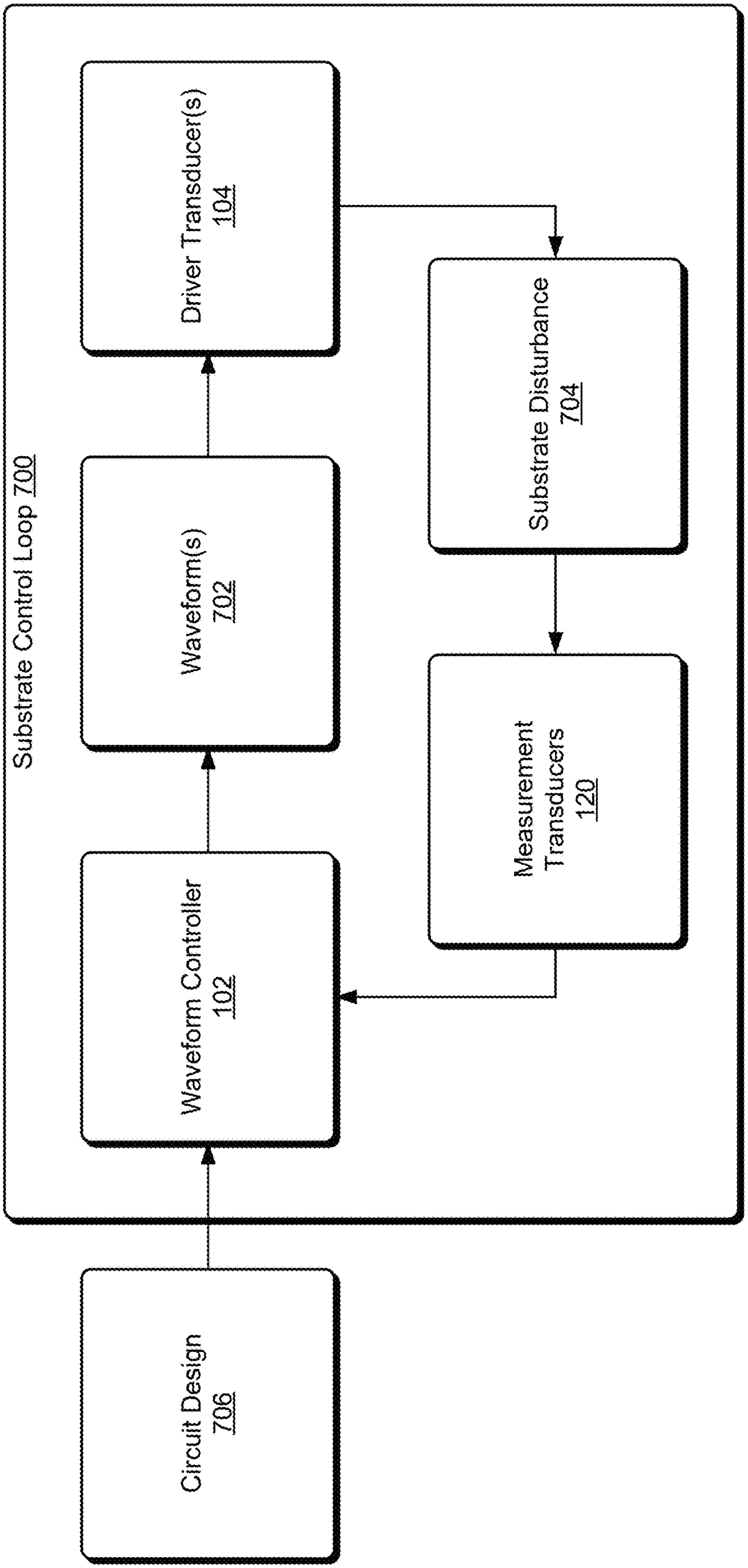
FIG. 7 illustrates an example substrate control loop for acoustic-controlled material deposition in accordance with one or more aspects.

FIG. 7 illustrates a substrate control loop 700 for acoustic-controlled material deposition in accordance with one or more aspects. The control loop 700 begins at the waveform controller 102. The waveform controller 102 may need to be calibrated before it can determine the appropriate waveforms to produce a particular circuit design. Calibration may be enabled through observations of an effect caused by exposing the substrate to a particular waveform.

In the substrate control loop 700, the waveform controller 102 may generate the waveforms 702. The waveforms 702 may include one or more waveforms to be transmitted as acoustic signals by the transducers 104. When the transducers 104 include multiple transducers, the various transducers 104 may each transmit the same or different waveforms 702 provided by the waveform controller 102. The waveforms 702 may be provided as signaling transmitted from the waveform controller 102 to the transducers 104. The signaling may provide an indication of one or more parameters of the waveform 702 (e.g., frequency or amplitude). During the initiation of calibration, the waveforms 702 may be chosen at random or determined from a predetermined set of calibration waveforms accessible to the waveform controller 102.

The one or more waveforms 702 may be transmitted to the driver transducers 104 for transmission of the waveforms 702 as acoustic signals. The acoustic signals may cause disturbances in the substrate 704, and these disturbances in the substrate 704 may be measured by the measuring transducers 120. While some implementations will be described specifically, it should be understood that many possible solutions exist to measure the effect of the acoustic signals on the substrate. For example, the expansion or compression of portions of the substrate, inertial data from portions of the substrate, displacement data of portions of the substrate, stress data from portions of the substrate, or any other data may be measured to determine the effect of the acoustic signals on the substrate.

In a specific example, the measuring transducers 120 may include stress sensors located on the substrate. The stress sensors may determine the internal force (e.g., expansion or compression) resulting from the acoustic signals disturbing the substrate. In another example, the measuring transducers 120 may include a displacement sensor, a laser sensor, or a radar or lidar sensor capable of measuring the displacement of certain portions of the substrate. For example, the measuring transducers 120 may include a displacement sensor located on the substrate. The displacement sensor may be capable of measuring the displacement of the portion of the substrate to which it is fixed. The measuring transducers 120 may include a laser sensor configured to transmit a laser that is reflected off of the substrate and received at a receive sensor. When the substrate displaces, the reflection of the laser may be altered, which may be measured at the receive sensor, thereby measuring the displacement of the substrate. Similarly, a radar sensor or lidar sensor may determine displacement data based on the reflections of signals off of the substrate. Generally, however, the measuring transducers may provide data related to the effect of the acoustic signals on the substrate.

Alternatively or in addition to these measurements, the measuring transducers 120 may measure the success of material deposition at portions of the substrate. Specifically, the substrate may be exposed to the material while the acoustic signals cause disturbances in the substrate 704. This may result in particular locations where the material deposition succeeds or fails. This pattern may be measured to determine the effect of the acoustic signals on the substrate.

The data collected by the measuring transducers 120 may be provided to the waveform controller 102. The waveform controller 102 may analyze the data to determine a correlation between the waveforms 702 and the data collected by the measuring transducers 120. In aspects, this correlation may be related to the arrangement of the transducers 104. The waveform controller 102 may store an indication of the arrangement of transducers 104 to properly analyze the data and generate the waveforms 702.

After receiving data related to the initial waveforms 702, the waveform controller 102 may determine a different set of waveforms 702 to enable the transducers 104 to disturb the substrate in a different manner. This disturbance may be measured by the measuring transducers 120 and provided to the waveform controller 102. Once the waveform controller 102 has collected a sufficient amount of data to determine the effect of various waveform parameters on the disturbance of the substrate, the waveform controller 102 may determine the specific waveform that is to be transmitted to achieve a particular deposition pattern.

During each iteration of the control loop 700, the waveform controller 102 may generate the waveforms 702 in a manner that maximizes the knowledge gained from each set of measurements. For example, the waveform controller 102 may define the waveforms 702 to have certain characteristics that have not been analyzed by the waveform controller 102 previously. Alternatively or additionally, sensor data collected from previous waveform exposures or current waveform exposures could be stored to be used in creating machine learning models. The waveform controller 102 may generate the waveforms 702 by varying a single parameter each iteration or by varying multiple parameters each iteration. In other examples, the waveform controller 102 may simply determine the waveforms 702 by selecting waveforms from a predetermined set of calibration waveforms or based on a user input.

Once calibration has been completed, the waveform controller 102 may receive a circuit design 706, which indicates the desired deposition pattern. The waveform controller 102 may determine the waveforms 702 that are to be transmitted to achieve the desired deposition pattern. These waveforms 702 may be determined based on the expected effects on the substrate (e.g., based on the correlation of the waveform and the substrate disturbance as determined during calibration). The driver transducers 104 may transmit these waveforms 702 as acoustic signals to cause disturbances in the substrate 704 while the substrate is exposed to the material. In aspects, these disturbances in the substrate 704 may be measured even after calibration has been completed to determine the success of the waveforms 702 in causing disturbances in the substrate that produce the desired deposition pattern. Alternatively, the measuring transducers 120 may be removed or deactivated after calibration is complete.

Calibration may occur before each instance in which material is deposited at the substrate. In other instances, calibration may only occur when the waveform controller 102 is initialized or when factors related to the calibration (e.g., the transducer arrangement or properties of the substrate) are changed. Calibration may vary based on the arrangement of transducers 104 with respect to the substrate or the properties of the substrate. Thus, calibration may be unnecessary across different substrates when these parameters are held constant. In this way, acoustic-controlled material deposition may be scalable to meet higher production requirements across similar configurations, even when different circuit designs 706 are to be deposited.

The waveform controller 102 may also use sensor data (e.g., from measurement transducers 120) to correct for irregularities across processes or irregularities in different substrates. This may be done by adjusting the phase of the waveforms 702 between two transducers (e.g., transducers 104 or measurement transducers 120) to adjust the expansion/compression of the substrate or the data collection. In this way, the waveform controller 102 may adjust for various irregularities and error factors.

Example Transducer

Figure 8:
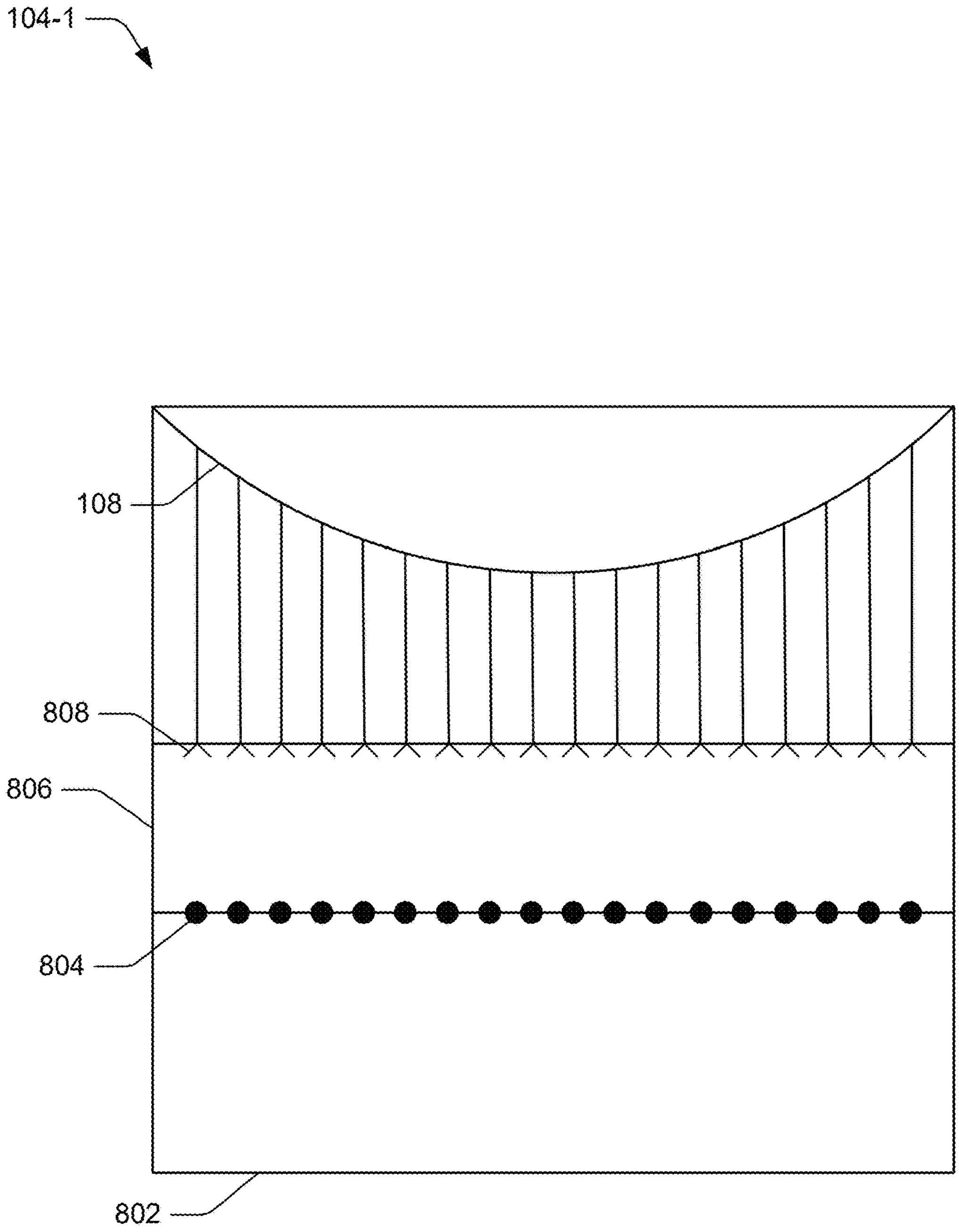
FIG. 8 illustrates an example transducer for acoustic-controlled material deposition, including a microelectromechanical systems (MEMS) array.

FIG. 8 illustrates an example transducer 104-1 for acoustic-controlled material deposition. The transducer 104-1 may be an example implementation of the transducers 104 of FIG. 1. The transducer 104-1 may include a base 802, which may connect to one or more electrical connectors to receive a waveform from the waveform controller. The base 802 of the transducer 104-1 may include internal circuitry to transmit the electronic signal to the electronic pins 804. The electronic pins 804 may be implemented as part of a microelectromechanical systems array (MEMS array 806), which processes electronic signals to create mechanical signals. The signals may be transmitted from the electronic pins 804 through the MEMS array 806 to cause mechanical operation at the actuators 808. The mechanical operation of the actuators 808 may cause disturbances in the substrate 108, which may control the deposition of material at the surface of the substrate 108.

In general, the MEMS array 806 may include a combination of electrical and mechanical components. The MEMS array 806 may be configured to convert the electrical signals received at the electronic pins 804 into mechanical operations to be performed by the actuators 808. For example, the actuators 808 may act as a speaker, and the MEMS array 806 may be configured to transmit current through a coil to alter a magnetic field around the speaker and cause the speaker to displace. When the speaker displaces, the mechanical energy may be converted into an acoustic wave that disturbs the substrate 108. The transmission of current through the coil may be controlled based on the waveform received from the waveform controller. In some instances, the MEMS array 806 may cause mechanical motion individually, which may redirect existing acoustic waves. This mechanical movement may be controlled by the waveform controller. In this way, the waveform controller may control the deposition of material based on a particular deposition pattern.

As illustrated, the transducer 104-1 includes multiple actuators 808, which may each perform mechanical operations to generate the acoustic signals. Although illustrated as multiple actuators 808, which may each generate one or more acoustic signals (e.g., a portion of the waveform received from the waveform controller), the actuators 808 may include a single actuator, for example, a speaker, configured to generate an acoustic signal in accordance with the waveform. Moreover, although shown as coupled to the substrate 108, the transducer 104-1 may be proximate to and directed towards the substrate 108 without physically contacting the substrate 108. In this way, the transducer 104-1 is not limited to being fixed to the substrate or located in any particular area.

Figure 9:
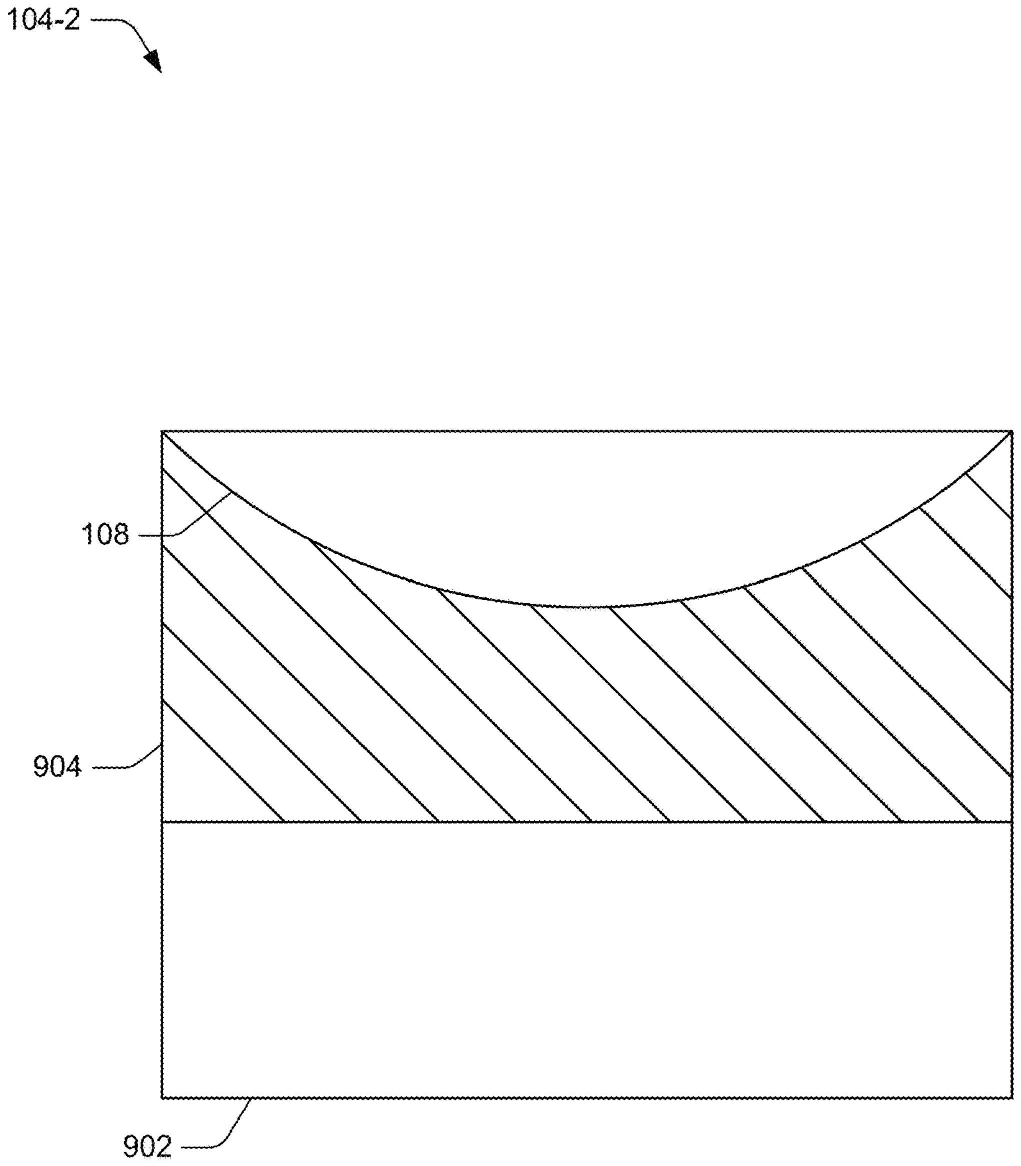
FIG. 9 illustrates an example transducer for acoustic-controlled material deposition, including an intermediary between the transducer and a substrate.

FIG. 9 illustrates an example transducer 104-2 for acoustic-controlled material deposition, including an intermediary 904 between the transducer 104-2 and a substrate 108. The transducer 104-2 may be an example implementation of the transducers 104 of FIG. 1. The transducer 104-2 includes a base 902 and an intermediary 904 that couples the base 902 to the substrate 108.

The base 902 may be communicatively coupled to the waveform controller to enable the base to receive signaling indicative of the waveform to be transmitted by the transducer 104-2 as an acoustic signal. The base 902 may include one or more aspects of the transducer, for example, the base 902 may include all or some of the portions of the transducer detailed with respect to FIG. 8. Thus, although illustrated as the base 902 and the intermediary 904, the transducer 104-2 may include electrical pins, a MEMS array, or actuators.

The intermediary 904 may be designed to couple the base 902 to the substrate 108. As such, the intermediary 904 may be designed to fit the shape of the substrate 108 and the base 902. To enable the acoustic signals from the transducer 104-2 to disturb the substrate 108, the intermediary 904 may be composed of a material that does not materially dampen the acoustic signals. Although a single implementation of the intermediary 904 is shown, the intermediary 904 may be composed of multiple physical structures that couple with one another. In aspects, the intermediary 904 may include a first piece coupled to the substrate and a second piece coupled to the base. The first piece and the second piece may be manufactured from the same or different materials and the two pieces may be configured to be mated with one another to connect the base 902 to the substrate 108.

Although shown as connecting the edge of the substrate 108, the intermediary 904 may connect the base 902 to any portion of the substrate 108. The intermediary 904 may connect to the substrate 108 at a single point or at multiple points. The transducer 104-2 may be coupled to the substrate in multiple dimensions, for example, the intermediary 904 may couple to the edge of the substrate at multiple points and at multiple heights along the edge of the substrate. Thus, it is to be appreciated that other configurations of the transducer 104-2 may be suitable for acoustic-controlled material deposition.

Example Methods

The following methods are illustrated as a set of blocks that specify operations that may be performed but are not necessarily limited to the order or combinations shown for performing the operations by the respective blocks. Further, any of one or more of the operations may be repeated, combined, reorganized, or linked to provide a wide array of additional and/or alternate methods. The techniques are not limited to performance by one entity or multiple entities operating on one device. In some aspects, operations or acts of the following methods are implemented by or managed by the waveform controller 102, a transducer (e.g., the transducers 104 and/or measuring transducers 120), and/or the material deposition system 110. For clarity, the methods are described with respect to the elements or implementations described in FIG. 1.

Figure 10:
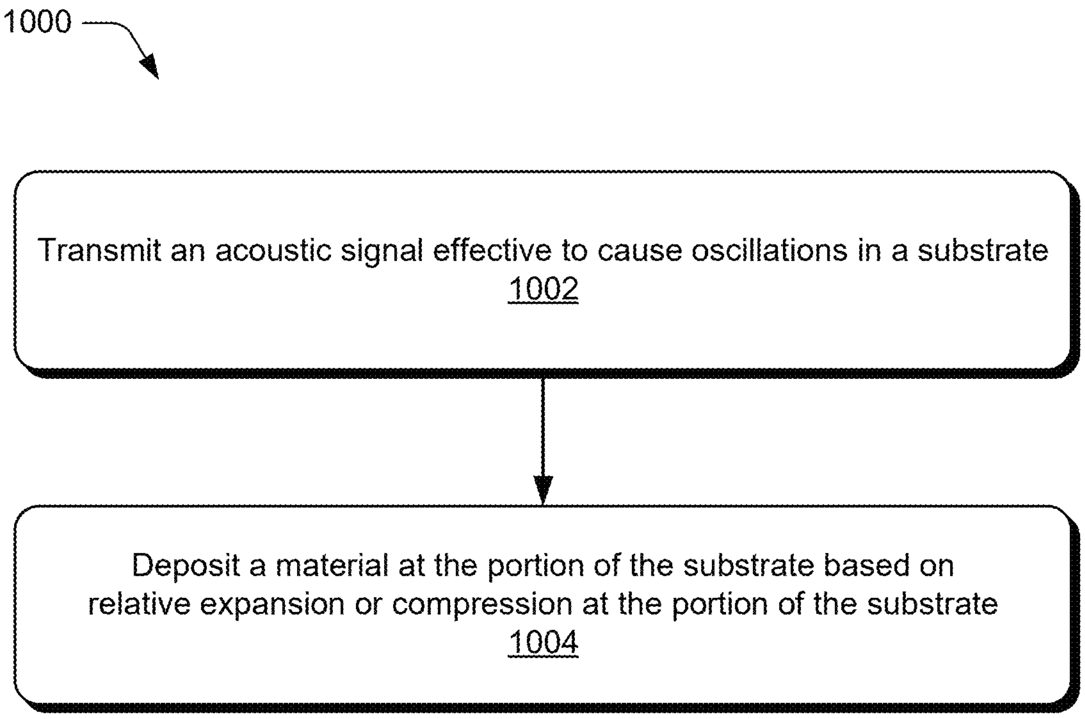
FIG. 10 illustrates an example method for performing one or more aspects of acoustic-controlled material deposition.

FIG. 10 illustrates an example method 1000 for performing one or more aspects of acoustic-controlled material deposition. The method 1000 may enable material 112 to be selectively deposited at the surface of a substrate 108 in accordance with a design.

At 1002, an acoustic signal 106 is transmitted by a transducer 104 to cause oscillations in a substrate 108. The acoustic signal 106 may be based on a waveform determined by a waveform controller 102. The waveform controller 102 may generate waveforms that result in a particular deposition pattern in accordance with a particular design. The oscillations the substrate 108 may cause expansion or compression in a portion of the substrate 108 relative to other portions of the substrate 108. In aspects, these oscillations in the substrate may be due to an oscillation of the acoustic signals 106. In some examples, the oscillations may occur at the atom level, which may enable the deposition of the material 112 to be controlled at a resolution of a single atom.

At 1004, a material deposition system 110 may deposit material 112 at the portion of the substrate 108 based on the relative expansion or compression at the portion of the substrate 108. For example, the portion of the substrate 108 may have a lattice structure that matches a preferred lattice structure for deposition due to the relative expansion or compression at that location. As a result, material 112 may be more successful in depositing at the portion of the substrate 108. By controlling the oscillations in the substrate 108, it may be possible to selectively deposit material 112 at the surface of the substrate 108. This deposition may be performed with a fine resolution and thus, may enable the implementation of features smaller than ten nm. The techniques may not require individual depositions or alterations in each location where this accuracy is required, thereby enabling the techniques to be scaled to larger production requirements.

Figure 11:
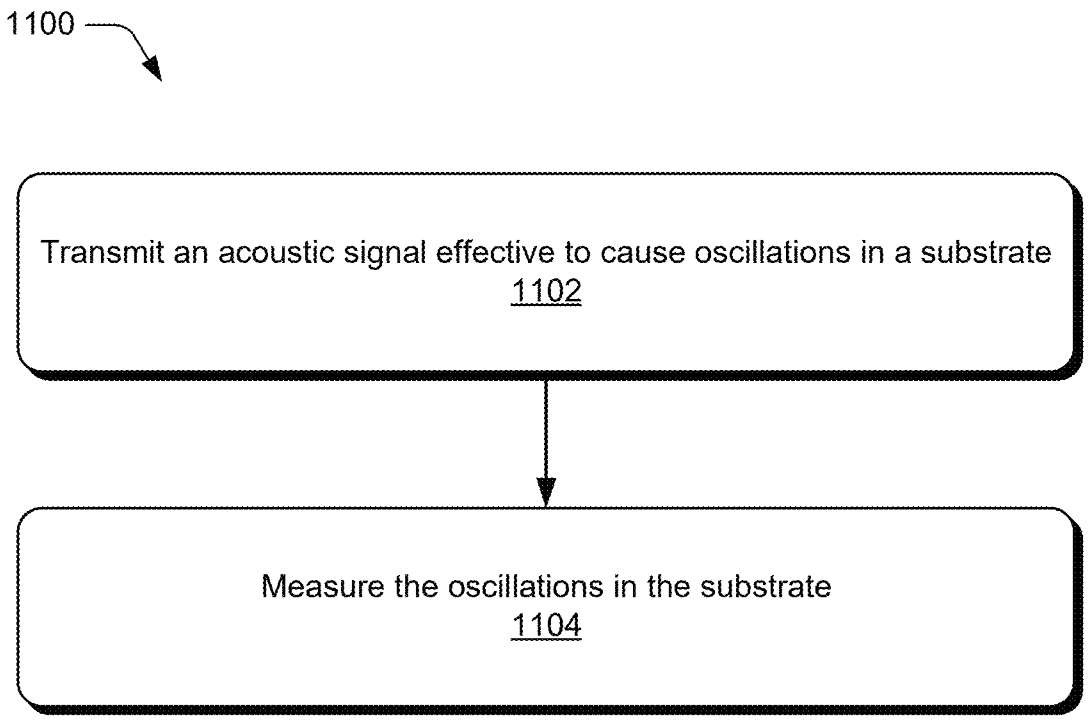
FIG. 11 illustrates an example method for calibrating acoustic-controlled material deposition in accordance with one or more aspects.

FIG. 11 illustrates an example method 1100 for calibrating acoustic-controlled material deposition in accordance with one or more aspects. The method 1100 may enable a waveform controller 102 to determine how waveforms having various parameters will disturb a substrate 108.

At 1102, a transducer 104 transmits an acoustic signal 106 effective to cause oscillations in a substrate 108. The acoustic signal 106 may be based on a waveform generated by the waveform controller 102. During calibration, the waveform may be generated from a predetermined set of calibration waveforms, from a user input, or based on a predicted information gain. Specifically, a set of predefined waveforms to be transmitted and measured during calibration may be accessible to the waveform controller. Alternatively or additionally, a user (e.g., a design engineer) may determine which waveform to generate to calibrate the waveform controller 102. In some cases, the waveform controller 102 may use a predictive algorithm to determine the waveform that will provide the most information on a correlation between the waveform and the resulting oscillations in the substrate 108.

At 1104, measuring transducers 120 measure the oscillations at the substrate. The measuring transducers 120 may measure the displacement, stress, or acceleration of the substrate 108 due to the acoustic signals. The data may be provided to the waveform controller 102, where it is analyzed to determine the correlation between the waveform and the oscillations in the substrate 108. The waveform controller 102 may then generate a different waveform and the measurement process may begin again based on the different waveform. This loop may continue until the waveform controller 102 receives enough data to accurately determine a correlation between the waveform and the oscillations in the substrate 108.

Figure 12:
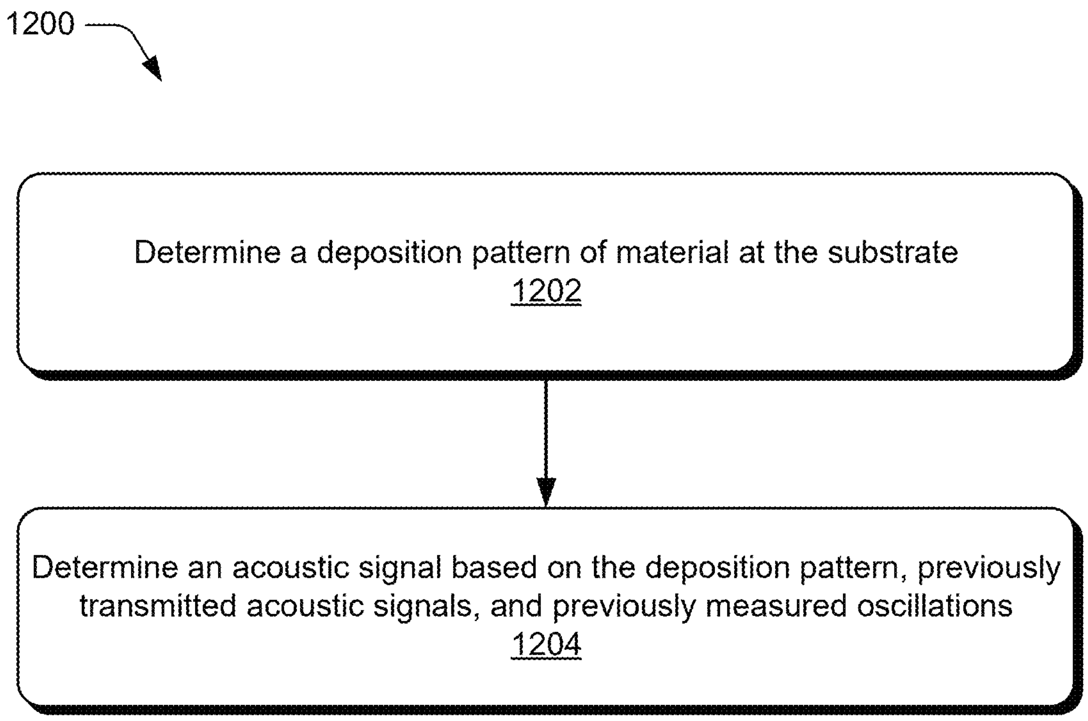
FIG. 12 illustrates an example method for implementing a design in accordance with one or more aspects of acoustic-controlled material deposition.

FIG. 12 illustrates an example method 1200 for implementing a design in accordance with one or more aspects of acoustic-controlled material deposition. In aspects, a waveform controller 102 may determine which waveforms are to be transmitted as acoustic signals 106 to enable deposition to succeed at specific locations based on a particular design. In aspects, the waveform controller 102 may be calibrated before receiving a design.

At 1202, a deposition pattern of material at the substrate 108 is determined. The depositing pattern may be based on a design input by a user. The design may indicate multiple layers to be deposited at the substrate individually. The waveform controller 102 may individually determine each layer for deposition at the substrate 108. A waveform may be determined for each individual layer of the design.

At 1204, an acoustic signal 106 is determined based on the deposition pattern, the previously transmitted acoustic signals, and previously measured oscillation. For example, the waveform controller 102 may determine a waveform to transmit to the transducer 104, which the transducer 104 may transmit as the acoustic signal 106. The waveform may be based on previous waveforms and measurements taken during the calibration process. For example, these waveforms and measurements may enable the waveform controller 102 to determine a correlation between various parameters of the waveform and the oscillations in the substrate 108. Based on the desired deposition pattern and this correlation, the waveform controller 102 may determine which waveforms are to be transmitted to enable successful deposition of the material 112 in accordance with the deposition pattern. In this way, acoustic-controlled material deposition may provide a scalable and accurate technique to deposit material at the surface of a substrate to implement a design.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

Additional Examples

Examples of acoustic-controlled material deposition are provided below:

Example 1: A method comprising: transmitting, by a transducer, a mechanical signal effective to cause oscillations in a substrate, the oscillations causing relative expansion or compression at a portion of the substrate; and responsive to transmitting the mechanical signal, depositing a material at the portion of the substrate based on the relative expansion or compression at the portion of the substrate.

Example 2: The method recited by any of the previous examples, wherein depositing the material at the portion of the substrate based on the relative expansion or compression at the portion of the substrate comprises depositing the material at the portion of the substrate when a first lattice structure of the material corresponds to a second lattice structure of the portion of the substrate.

Example 3: The method recited by any of the previous examples, wherein depositing the material at the portion of the substrate comprises not depositing the material at an additional portion of the substrate, the additional portion of the substrate adjacent to the portion of the substrate.

Example 4: The method recited by any of the previous examples, wherein not depositing the material at the additional portion does not include using photolithography.

Example 5: The method recited by any of the previous examples, wherein depositing the material at the portion of the substrate includes depositing the material through chemical vapor deposition or molecular-beam epitaxy.

Example 6: The method recited by any of the previous examples, wherein: the mechanical signal includes multiple mechanical signals transmitted from multiple transducers; and the oscillations are caused by the multiple mechanical signals.

Example 7: The method recited by any of the previous examples, further comprising, responsive to depositing the material at the portion of the substrate, depositing a different material at the substrate effective to at least deposit the other material at other portions of the substrate having not been deposited with the material.

Example 8: The method recited by any of the previous examples, further comprising, responsive to depositing the material at the portion of the substrate, etching the deposited material.

Example 9: The method recited by any of the previous examples, wherein depositing the material at the portion of the substrate comprises depositing the material at a resolution less than ten nanometers.

Example 10: The method recited by any of the previous examples, wherein the mechanical signal is a first mechanical signal and the oscillations are a first oscillations, the method further comprising: prior to transmitting the first mechanical signal, transmitting, by the transducer, a second mechanical signal effective to cause second oscillations in the substrate, the second oscillations effective to cause relative expansion or compression at the portion of the substrate; and measuring, by a sensor, the second oscillations in the substrate, wherein transmitting the first mechanical signal is based on the second mechanical signal and the measurement of the second oscillations.

Example 11: The method recited by any of the previous examples, further comprising determining a deposition pattern of the material at the substrate, wherein transmitting the mechanical signal is based on the deposition pattern.

Example 12: A device comprising: at least one processor; and a computer-readable storage media that, when executed by the at least one processor, causes the at least one processor to: transmit, to at least one transducer, signaling effective to cause the at least one transducer to transmit a mechanical signal, the mechanical signal effective to cause oscillations in a substrate, the oscillations causing relative expansion or compression at a portion of the substrate; and transmit, to a deposition system, signaling effective to cause the deposition system to deposit a material at the portion of the substrate based on the relative expansion or compression at the portion of the substrate.

Example 13: The device recited by any of the previous examples, further comprising the at least one transducer, wherein the at least one transducer is coupled to at least one of an edge of the substrate or a bottom surface of the substrate.

Example 14: The device recited by any of the previous examples, wherein the mechanical signal is a first mechanical signal and the oscillations are first oscillations, the processor further configured to: prior to transmission of the first mechanical signal, transmit, to the at least one transducer, signaling effective to cause the at least one transducer to transmit a second mechanical signal, the second mechanical signal effective to cause second oscillations at the substrate, the second oscillations effective to cause relative expansion or compression at the portion of the substrate; and measure, by a sensor, the second oscillations in the substrate, wherein transmitting the first mechanical signal is based on the second mechanical signal and the measurement of the second oscillations.

Example 15: The device recited by any of the previous examples, further comprising the sensor, wherein the sensor is coupled to the substrate at one or more of: an edge of the substrate, a bottom surface of the substrate, and a top surface of the substrate.

Example 16: The device recited by any of the previous examples, further comprising the sensor, wherein the sensor comprises: a stress sensor, a displacement sensor, an inertial measurement unit, or a laser sensor.

Example 17: The device recited by any of the previous examples, wherein the sensor comprises the laser sensor, the laser sensor configured to measure a reflection of a laser off of the substrate.

Example 18: A computer-readable storage media comprising computer-readable instructions that, when executed by at least one processor, cause the at least one processor to: transmit, to at least one transducer, signaling effective to cause the at least one transducer to transmit a mechanical signal, the mechanical signal effective to cause oscillations in a substrate, the oscillations causing relative expansion or compression at a portion of the substrate; and transmit, to a deposition system, signaling effective to cause the deposition system to deposit a material at the portion of the substrate based on the relative expansion or compression at the portion of the substrate.

Example 19: The computer-readable storage media recited by any of the previous examples, wherein the mechanical signal is a first mechanical signal and the oscillations are first oscillations, the processor further configured to: prior to transmission of the first mechanical signal, transmit, to the at least one transducer, signaling effective to cause the at least one transducer to transmit a second mechanical signal, the second mechanical signal effective to cause second oscillations in the substrate, the second oscillations effective to cause relative expansion or compression at the portion of the substrate; and measure, by a sensor, the second oscillations in the substrate, wherein transmitting the first mechanical signal is based on the second mechanical signal and the measurement of the second oscillations.

Example 20: The computer-readable storage media recited by any of the previous examples, wherein the at least one processor is further configured to: determine a deposition pattern of the material at the substrate, wherein transmitting the mechanical signal is based on the deposition pattern.

CONCLUSION

Although aspects of the described apparatuses, systems, and methods for implementing acoustic-controlled material deposition have been described in language specific to features and/or methods, the subject of the appended claims is not necessarily limited to the specific features or methods described. Rather, the specific features and methods are disclosed as example implementations of acoustic-controlled material deposition, and other equivalent features and methods are intended to be within the scope of the appended claims. Further, various aspects of acoustic-controlled material deposition are described, and it is to be appreciated that each described aspect can be implemented independently or in connection with one or more other described aspects.

What is claimed is:

1. A method comprising:

transmitting, by a transducer, a mechanical signal effective to cause oscillations in a substrate, the oscillations causing a first relative expansion or compression at a first portion of the substrate and causing a second relative expansion or compression at a second portion of the substrate, the first relative expansion or compression being different from the second relative expansion or compression, the first relative expansion or compression causing a first lattice structure at the first portion of the substrate and the second relative expansion or compression causing a second lattice structure at the second portion of the substrate; and depositing, using chemical vapor deposition (CVD) a material at the first portion of the substrate based on the first lattice structure at the first portion of the substrate corresponding to a lattice structure of the material, the lattice structure of the material not corresponding to the second lattice structure effective to cause deposition of the material to be more successful at the first portion than the second portion.

2. The method of claim 1, wherein depositing the material at the first portion of the substrate comprises not depositing the material at the second portion of the substrate, the second portion of the substrate adjacent to the first portion of the substrate.

3. The method of claim 2, wherein not depositing the material at the second portion does not include using photolithography.

4. The method of claim 1, wherein:

the mechanical signal includes multiple mechanical signals transmitted from multiple transducers; and the oscillations are caused by the multiple mechanical signals.

5. The method of claim 4, wherein the multiple mechanical signals cause deposition points in a grid along a surface of the substrate, the deposition points having the first lattice structure.

6. The method of claim 1, further comprising, responsive to depositing the material at the first portion of the substrate, depositing a different material at the substrate effective to at least deposit the different material at other portions of the substrate having not been deposited with the material.

7. The method of claim 1, further comprising, responsive to depositing the material at the first portion of the substrate, etching the deposited material.

8. The method of claim 1, wherein the mechanical signal is a first mechanical signal and the oscillations are a first oscillations, the method further comprising:

prior to transmitting the first mechanical signal, transmitting, by the transducer, a second mechanical signal effective to cause second oscillations in the substrate, the second oscillations effective to cause relative expansion or compression at the first portion of the substrate; and measuring, by a sensor, the second oscillations in the substrate, wherein transmitting the first mechanical signal is based on the second mechanical signal and the measurement of the second oscillations.

9. The method of claim 1, further comprising determining a deposition pattern of the material at the substrate, wherein transmitting the mechanical signal is based on the deposition pattern.

10. The method of claim 1, wherein depositing using CVD deposits the material at the first portion at deposition points of the first lattice structure.

11. The method of claim 1, wherein the transmitting the mechanical signal effective to cause oscillations in the substrate is further effective to cause the oscillations in concentric circles.

12. The method of claim 1, wherein depositing using CVD deposits the material at the first portion at the first lattice structure at a resolution of one to four atoms.

13. The method of claim 12, wherein the resolution is one atom.

14. The method of claim 12, wherein depositing using CVD deposits the material at the second portion at the second lattice structure at a resolution different than at the first portion.

15. The method of claim 1, wherein the corresponding is matching, the matching being of the lattice structure of the material with the first lattice structure.

16. The method of claim 1, wherein the first expansion or compression causes less atomic oscillation at the first portion than the second expansion or compression causes at the second portion.

17. The method of claim 1, wherein the first expansion or compression is expansion, the expansion causing an expansion of atoms at the first portion of the substrate, the expansion of atoms causing the first lattice structure, the atoms of the first lattice structure expanded relative to atoms of the substrate that are compressed or not expanded.

18. The method of claim 1, wherein the first expansion or compression is compression, the compression causing a compression of atoms at the first portion of the substrate, the compression of atoms causing the first lattice structure, the atoms of the first lattice structure compressed relative to atoms of the substrate that are expanded or not compressed.

19. The method of claim 1, wherein the CVD comprises metalorganic CVD.

20. The method of claim 1, wherein the CVD comprising vapor-phase epitaxy.

* * * * *